United States Patent
Taussig et al.

(10) Patent No.: US 7,039,780 B2
(45) Date of Patent: May 2, 2006

(54) DIGITAL CAMERA MEMORY SYSTEM

(75) Inventors: Carl Taussig, Redwood City, CA (US); Richard Elder, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 525 days.

(21) Appl. No.: 09/875,833

(22) Filed: Jun. 5, 2001

(65) Prior Publication Data

US 2002/0184459 A1 Dec. 5, 2002

(51) Int. Cl.
*G06F 12/00* (2006.01)

(52) U.S. Cl. .................. 711/165; 711/103; 711/115; 348/207.99

(58) Field of Classification Search ............. 711/103, 711/115, 165; 348/207; 365/229; 355/229
See application file for complete search history.

(56) References Cited

U.S. PATENT DOCUMENTS

| | | | | |
|---|---|---|---|---|
| 5,438,549 A * | 8/1995 | Levy | ............................ | 365/229 |
| 5,589,719 A | 12/1996 | Fiset | | |
| 5,797,022 A * | 8/1998 | Shimotono et al. | .......... | 713/323 |
| 5,815,426 A * | 9/1998 | Jigour et al. | .................. | 365/51 |
| 5,893,919 A * | 4/1999 | Sarkozy et al. | ............ | 711/114 |
| 5,943,185 A * | 8/1999 | Bracken et al. | .......... | 360/99.06 |
| 6,031,964 A | 2/2000 | Anderson | | |
| 6,344,875 B1 * | 2/2002 | Hashimoto et al. | ....... | 348/207.1 |
| 6,388,908 B1 * | 5/2002 | Araki et al. | ................... | 365/45 |
| 6,463,509 B1 * | 10/2002 | Teoman et al. | ............. | 711/137 |
| 6,545,891 B1 * | 4/2003 | Tringali et al. | ............... | 365/51 |
| 6,584,541 B1 * | 6/2003 | Friedman et al. | ........... | 711/103 |
| 6,801,251 B1 * | 10/2004 | Kawaoka et al. | ........ | 348/231.3 |
| 2001/0013894 A1 * | 8/2001 | Parulski et al. | ............. | 348/207 |
| 2001/0036231 A1 * | 11/2001 | Easwar et al. | ......... | 375/240.19 |
| 2001/0043279 A1 * | 11/2001 | Niikawa et al. | ............ | 348/335 |
| 2001/0045884 A1 * | 11/2001 | Barrus et al. | ................ | 340/7.2 |
| 2002/0001032 A1 * | 1/2002 | Ohki | .......................... | 348/207 |
| 2002/0018130 A1 * | 2/2002 | Suemoto et al. | ............ | 348/231 |
| 2002/0048033 A1 * | 4/2002 | Tsukamoto et al. | ........ | 358/1.12 |
| 2002/0085112 A1 * | 7/2002 | Hiramatsu et al. | .......... | 348/362 |
| 2002/0085300 A1 * | 7/2002 | Bracken et al. | ............... | 360/69 |

FOREIGN PATENT DOCUMENTS

| EP | 0563997 | | 2/1993 |
|---|---|---|---|
| EP | 0563997 | A1 | 10/1993 |
| EP | 1133167 | A1 | 9/2001 |

\* cited by examiner

Primary Examiner—Woo H. Choi

(57) ABSTRACT

A data storage system that is adapted for storing image data in digital cameras comprises a temporary data storage circuit coupled, in use, to receive image data from the camera, and a permanent data storage circuit coupled, in use, to receive image data from the temporary data storage circuit. A control circuit is coupled to the temporary data storage circuit and the permanent data storage circuit to effect transfer of image data from the temporary data storage circuit to the permanent data storage circuit upon occurrence of a predetermined event. The permanent data storage circuit may be in the form of a write-once non-volatile memory module, which is replaceable in the storage system. The temporary data storage circuit can be a RAM or Flash memory that temporarily stores a image data from the camera when a picture is taken. Then, the user may review the picture before it is permanently stored upon the occurrence of the predetermined event. The predetermined event may comprise, for example, another picture being taken, removal of power (e.g. turning the camera off), or expiration of a preset time period.

18 Claims, 2 Drawing Sheets

DIGITAL CAMERA MEMORY SYSTEM

FIELD OF THE INVENTION

The present invention relates to the field of digital memory circuits, and in particular to write once memory for use in digital cameras and the like.

BACKGROUND OF THE INVENTION

In a digital camera, an image is captured using a digital image sensor, such as a charge coupled device (CCD) or CMOS sensor formed in an integrated circuit. Signals are then output from the image sensor to form digital data representing the captured image. The image data must be stored in order for the captured image to be reproduced by display on a viewing screen, printed on a computer printer, or the like. Presently, most digital cameras have rewritable memory built into the camera or provided in a removable storage media card, for example. The use of rewritable memory is advantageous because it allows the user to easily discard a stored image if it does not meet the user's requirement. By discarding the image, the image data is erased from the camera memory, which frees storage space for more further images. A disadvantage of rewritable memory is that it is relatively expensive and does not necessarily provide a permanent record of the image data, like a photographic negative does for conventional photography.

Portable digital cameras for still pictures, for example, generate large amounts of digital data representing images. Each digital image may require up to several megabytes (MB) of data storage, and such storage must be available in the camera. To provide for this type of data storage application, the storage memory should be relatively low in cost for sufficient capacities of around 10 MB to 1 gigabyte (GB). The storage memory should also be low in power consumption (e.g. <<1 Watt) and have relatively rugged physical characteristics to cope with the portable battery powered operating environment. For archival storage, data need only be written to the memory once. Preferably the memory should have a short access time (preferably less than 1 ms) and moderate transfer rate (e.g. 20 Mb/s). Preferably, also, the storage memory should be able to be packaged in an industry standard interface module, such as PCMCIA or Compact Flash card.

One form of storage currently used for application in portable devices such as digital cameras is Flash memory. This meets the desired mechanical robustness, power consumption, transfer, and access rate characteristics mentioned above. However, a major disadvantage is that Flash memory remains relatively expensive ($1.50–$2 per MB). Because of the price it is generally unreasonable to use Flash memory storage as an archive device, thus requiring data to be transferred from it to a secondary archival storage.

Magnetic "hard disc" storage can be used for archival storage, even in portable devices. Miniature hard disc drives are available for the PCMCIA type III form factor, offering capacities of up to 1 GB. However, such disc drives are still relatively expensive ($0.5 per MB), at least partially because of the relatively high fixed cost of the disc controller electronics. Miniature hard drives have other disadvantages when compared to Flash memory, such as lower mechanical robustness, higher power consumption (~2 to 4W), and relatively long access times (~10 mS).

Removable optical storage discs can similarly be used, and offer one large advantage compared to hard disc. The removable optical media is very inexpensive, for example of the order of $0.03 per MB for Minidisc media. However in most other respects optical disc storage compares poorly with magnetic hard discs including relatively poor power consumption, mechanical robustness, bulk, and access performance.

Another form of archival storage is described in co-pending U.S. patent application Ser. No. 09/875,356, entitled "Non-Volatile Memory", the disclosure of which is hereby incorporated herein by reference. The memory system disclosed therein provides high capacity write-once memory at low cost for archival storage. Since the data storage is permanent, however, once image data is stored therein it cannot be erased by the user if the image is not suitable.

It would be desirable to provide a storage system for digital cameras and the like that has advantages of both write once and rewritable media.

SUMMARY OF THE INVENTION

In accordance with the principles of the present invention, there is provided a data storage system for a portable data generating appliance, such as a digital camera. The data storage system has a temporary data storage circuit coupled, in use, to receive data from the appliance, and a permanent data storage circuit coupled, in use, to receive data from the temporary data storage circuit. The data storage system further comprises a control circuit coupled to the temporary data storage circuit and the permanent data storage circuit, the control circuit being adapted to effect transfer of data from the temporary data storage circuit to the permanent data storage circuit.

Preferably the data storage system is contained in an interface card that is separable from the data generating appliance and, in use, is received by the data generating appliance to provide coupling for data transfer from the data generating appliance to said temporary data storage circuit. For example, the data storage system may be contained in an industry standard format interface card of a type currently in use in digital cameras, such as a Compact Flash, PCMCIA, Smart Media, Scan Disk card, or the like.

In the preferred form of the invention the permanent data storage circuit comprises a non-volatile memory module that is detachably coupled to the data storage system to allow a plurality of different memory modules to be used in a single data storage system. For example, the memory module may be removable and replaceable in the interface card. This allows a memory module containing write-once memory to be replaced when it has reached its data storage capacity with another, empty memory module, for example.

The temporary data storage circuit preferably comprises RAM or Flash memory and has a storage capacity sufficient to store data comprising at least one picture from the digital still image camera. The permanent data storage circuit has storage capacity sufficient to store a plurality of pictures.

The control circuit is preferably operative to effect transfer of data from the temporary data storage circuit to the permanent data storage circuit upon occurrence of a predetermined event. The predetermined event may comprise expiration of a predetermined time period from the data being received in the temporary data storage circuit from the data generating appliance.

The predetermined event may also comprise further data being received by the temporary data storage circuit from the data generating appliance. In that case, the control circuit can simultaneously control transfer of data from the temporary data storage circuit to the permanent data storage circuit and transfer the further data from the data generating appliance into the temporary data storage circuit.

In one form of the invention the data storage system derives primary operating power from the data generating appliance, wherein the predetermined event comprises disconnection of power supply from the data generating appliance to the data storage system. In that case, it is preferred that the data storage system include a short term power supply circuit adapted to supply power to the data storage system sufficient to transfer the data contents of the temporary data storage circuit to the permanent data storage circuit.

In accordance with the present invention, there is also provided a data storage device for a digital camera, comprising a temporary data storage circuit coupled, in use, to receive image data from the camera, and a permanent data storage circuit coupled, in use, to receive image data from the temporary data storage circuit. The data storage device also includes a control circuit coupled to the temporary data storage circuit and the permanent data storage circuit, the control circuit being adapted to effect transfer of image data from the temporary data storage circuit to the permanent data storage circuit upon occurrence of a predetermined event.

Preferably the permanent data storage circuit comprises a non-volatile memory module that is replaceable in the data storage device to allow a plurality of different memory modules to be selectively used therein. The non-volatile memory module preferably contains write-once memory sufficient to store image data for a plurality of pictures from the camera.

In a preferred embodiment the data storage device is contained in an interface card that is separable from the camera and, in use, is received by the camera to provide coupling for transfer of image data from the camera to the temporary data storage circuit.

In one form of the invention the temporary data storage circuit comprises RAM with capacity sufficient to store image data for at least one picture from the camera.

The predetermined event may comprise, for example, expiration of a predetermined time period from the image data being received in the temporary data storage circuit from the camera.

The predetermined event may also comprise further image data being received by the temporary data storage circuit from the camera. In that case, it is preferred that the control circuit be effective to simultaneously control transfer of image data from the temporary data storage circuit to the permanent data storage circuit and transfer the further image data from the camera into the temporary data storage circuit.

Where the data storage device derives primary operating power from the camera, the predetermined event may comprise disconnection of power supply from the camera to the data storage device. Preferably the data storage device includes a short term power supply circuit adapted to supply power to the data storage device in the absence of power from the camera sufficient to transfer the image data contents of the temporary data storage circuit to the permanent data storage circuit.

In accordance with the present invention, there is also provided a method for image data storage in a digital camera. The method includes obtaining image data generated by the digital camera representing at least one picture, and storing the image data in a temporary data storage circuit coupled to the digital camera. The method also includes transferring the image data from the temporary data storage circuit to a permanent data storage circuit coupled to the digital camera upon occurrence of a predetermined event.

The predetermined event may comprise expiration of a predetermined time period from the storage of the image data in the temporary data storage circuit. The predetermined event may also comprise obtaining further image data generated by the digital camera.

Preferably the temporary data storage circuit and said permanent data storage circuit are contained in an interface card that is removable from the digital camera.

Preferably the permanent data storage circuit comprises write-once memory that is contained in a memory module that is removable from the interface card. The temporary data storage circuit may comprise RAM or Flash memory, for example, sufficient to store image data for a single picture from the camera. The memory module provides storage capacity for a plurality of pictures.

BRIEF DESCRIPTION OF THE DRAWINGS

The invention is described in greater detail hereinafter, by way of example only, through description of a preferred embodiment thereof and with reference to the accompanying drawings in which.

DETAILED DESCRIPTION OF THE PREFERRED EMBODIMENT

Figure 1:
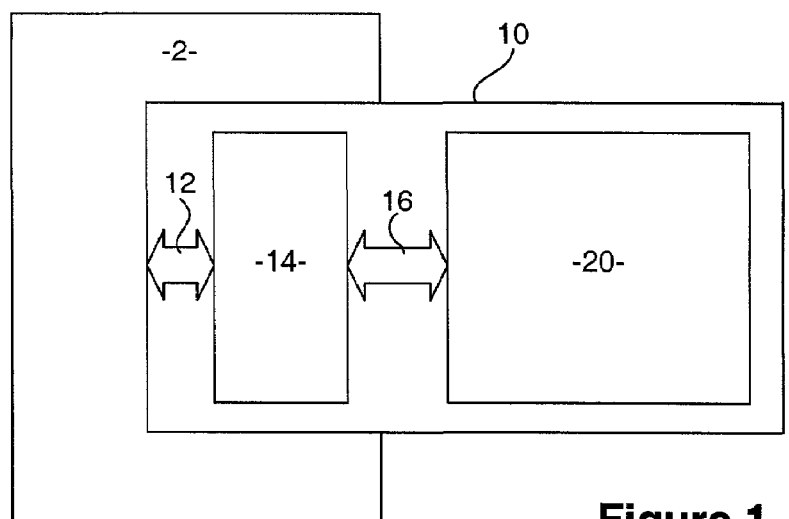
FIG. 1 is a block diagram of an appliance with a memory system according to an embodiment of the invention.

A memory storage system, and method for implementing such a system, suitable for portable data producing appliances such as digital cameras are disclosed herein. In the following description, for purposes of explanation, specific nomenclature and specific implementation details are set forth to provide a thorough understanding of the present invention. However, it will be apparent to one skilled in the art that these specific details are not necessarily required in order to practice the present invention.

In the following description, where "data" is referred to it will be appreciated that such "data" may be represented in various ways depending upon the context. As an example, "data" in a memory cell might be represented by a voltage level, a magnetic state, or a physical characteristic such as electrical resistance that presents a measurable effect such as voltage or current level or change to a sensing circuit, for instance. On the other hand, whilst on a bus or during transmission such "data" might be in the form of an electrical current or voltage signal. Furthermore, herein "data" in most circumstances is primarily binary in nature which may for convenience be referred to as represented by states of "0" and "1", but it will be appreciated that the binary states in practice might be represented by relatively different voltages, currents, resistances or the like and it is generally immaterial whether a particular practical manifestation represents a "0" or a "1".

A preferred embodiment of the present invention comprises a replaceable memory storage system for a digital camera that may employ data storage circuits and devices of the type described in the aforementioned co-pending U.S. patent. In order to provide a thorough understanding of the invention, the following detailed description is therefore presented in the context of such a data storage circuits and devices, although those skilled in the art will recognize that the invention is not limited in application to the described structure.

An embodiment of the present invention that is described in detail hereinafter provides a memory system that utilizes write-once memory. The memory system of the preferred embodiment is particularly useful for data storage in data generating appliances such as digital cameras and the like, although those skilled in the art will appreciate that the memory system and its various components and aspects can also be used in other applications. The preferred embodiment as described hereinafter is constructed to allow write-once memory to be used in place of rewritable memory in a digital camera. In the described embodiment, the memory system is incorporated into an industry standard portable interface card (PCMCIA or Compact Flash, for example) so that it can be used in existing and future products with such interfaces. It will be recognized, however, that the memory system of the invention may alternatively be incorporated in a custom designed interface, as desired.

A data generating appliance in the form of a digital still camera 2 is illustrated in block diagram form in FIG. 1, interfaced with a removable memory card 10 constructed according to the preferred embodiment of the invention. The memory card 10 plugs into the camera body, for example, establishing electrical connection through a card interface 12 enabling communication between the card 10 and camera 2. The card 10 comprises a write-once memory module 20 and module interface circuitry 14. The module interface circuitry 14 is coupled to the camera through the card interface 12 and is connected to the memory module 20 for communication through a module interface 16.

The memory card 10 is removable from the camera 2 and constructed in the manner of a conventional camera memory card, such as a Compact Flash, Secure Digital (SD), Smart-Media or PCMCIA card containing flash memory. The memory module 20 provides circuitry for non-volatile write-once data storage to store data representing pictures taken by the camera. The memory module, in the preferred embodiment, is constructed in accordance with the description in the aforementioned co-pending US patent application, although it is possible to employ other forms of non-volatile memory for this function in the alternative. The memory module preferably provides substantial data storage capability (e.g. tens to thousands of megabytes) to enable a plurality of digital pictures from the camera to be stored therein, either in a compressed or uncompressed format as appropriate for the particular camera. In the preferred implementation of the present invention the memory module is removable from the memory card to enable a plurality of different memory modules to be used in the same memory card. This enables the memory module to be replaced in the memory card when the limit of the memory module storage capacity has been reached.

Since the memory module 20 contains write-once memory, it is appropriate for archival data storage wherein the data, once stored, is preserved. This is somewhat like a photographic film, where pictures are stored thereon once, and the developed film is kept as a permanent record. Therefore, once the memory module 20 has been filled to capacity with data, another is required for further data storage. It would be possible to simply replace the entire memory card 10 in the camera 2, however that would mean the interface and control circuitry, as well as the memory card structure, is archived along with the memory module.

In order to reduce the data storage costs it is desirable that reusable and relatively expensive components of the memory system not be permanently coupled to the actual storage memory, and for that reason the memory module 20 is removable from the memory card 10 in the preferred embodiment. The bulk of the memory card 10 thus involves a one-off cost, and the memory modules 20 for insertion therein are fabricated inexpensively as discussed further hereinbelow.

Write-once data storage means that, effectively, data can only be written once to the memory and thereafter it remains unchangeable. In many forms of write-once memory it is not strictly true that the data stored therein cannot be changed at all after being initially written, however in general it cannot be changed arbitrarily, as those skilled in the art will appreciate. For example, most write-once memories are fabricated with each memory cell in a first binary state (e.g. representing a binary data "0"), and during a write procedure selected memory cells are changed into a second binary state (e.g. to represent the binary data "1"s). Often the change in the memory cell from the first binary state to the second is irreversible, such that once a data "1" is written it cannot be changed back to a data "0". This restricts the changes to the stored data that can be made after it has been written to the memory, wherein arbitrary data can only be written once and thereafter data "0"s, for example, can only be changed to data "1"s, and not the other way around.

For coupling between the module interface circuitry 14 and memory module 20 in the memory card 10, the module interface 16 is provided. Physically, the module interface 16 receives the memory module and provides electrical connections between the interface circuitry and memory module. Thus, a suitable form of plug and socket arrangement may be employed, although the most appropriate structure depends strongly upon the actual number of connections to be made. Connecting contacts on the memory module can be formed on the external surface thereof, for example, to enable edge connection schemes or land grid array (LGA) connections. Many kinds of connection schemes are possible, as will be recognized by those of skill in the art, for implementation without undue difficulty.

The module interface circuitry 14 includes memory module control circuitry for control, interface, detection, error correction coding (ECC) and the like for each removable memory module 20 when it is received in the card. Broadly, the memory module control circuitry implements the functions required to write data to and read data from the memory module in the memory card. The memory module control circuitry for use with the preferred write-once memory may generally resemble an "AT" style disk controller circuit, further including error correction (ECC) and defect management functions, as well as functions required to operate the memory module 20. These functions include:
  writing to the memory module including setting write voltages, setting write enable lines and controlling power supply striping;
  addressing the memory by converting logical addresses to address line patterns required to access physical memory locations;
  data read processing of sense line outputs; and
  parallel to serial conversion if required.

Figure 2:
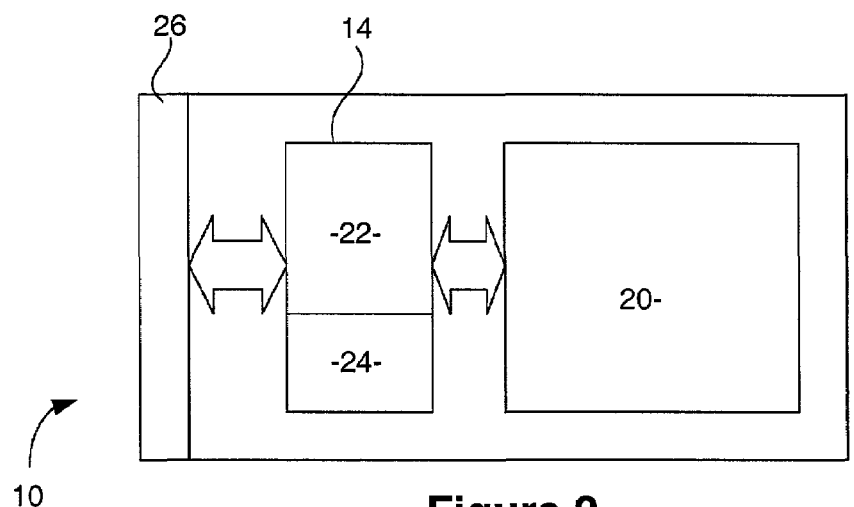
FIG. 2 is a functional block diagram of the memory system.

FIG. 2 is a functional block diagram of the memory card 10 illustrating an additional feature of the module interface circuitry 14. In the memory card 10 shown in FIG. 2 the module interface circuitry 14 includes control circuitry 22 and temporary data storage memory 24. The temporary storage memory may comprise RAM, for example, and has sufficient capacity (e.g. several megabytes) to store data representing a single picture from the camera 2. The RAM 24 acts as a form of buffer memory in a manner and for reasons discussed further herein below. Generally speaking, the temporary data storage memory is provided to store image data from the camera before it is passed to the write-once memory module. This allows an opportunity to discard the image data, if desired, before it is permanently stored in the memory module 20.

Figure 3:
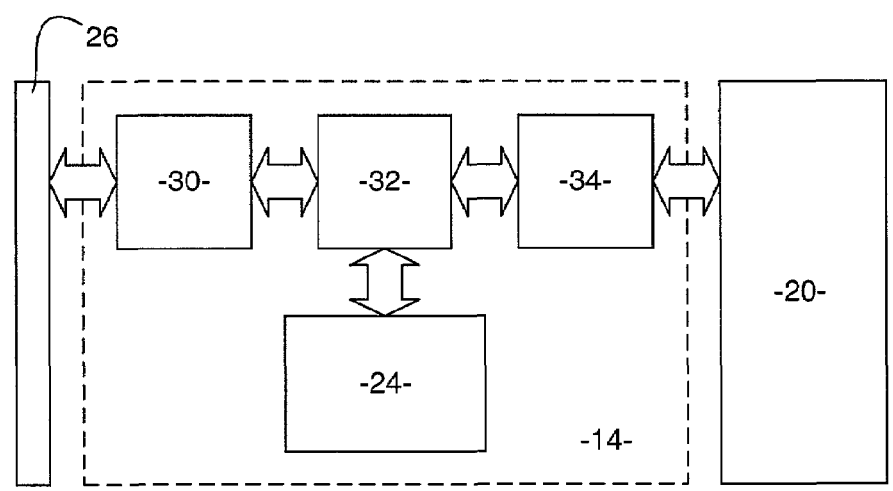
FIG. 3 is a more detailed functional block diagram of the memory system.

FIG. 3 is a functional block diagram of the memory card 10 showing greater detail of functional elements within the module interface circuitry block 14. As shown, the module interface circuitry 14 is coupled between a physical interface connector 26 and the memory module 20. The physical interface connector 26 is adapted to connect with a standard card connector in the camera, for example a PCMCIA or Compact Flash card connector. An appliance interface circuit 30 is coupled to the interface connector such that command signals passed from the camera to the memory card are received by the appliance interface circuit. The appliance interface circuit 30 is coupled to a temporary storage memory control read/write circuit in the form of a DMA controller 32 or the like. The DMA controller 32 is coupled to the RAM 24 and to the memory module control circuit 34. The memory module control circuit 34 is coupled to the write-once memory module 20.

The general operation of the memory card 10 is as follows. When a picture is taken by the digital camera 2, the image sensor therein generates image data representing the picture. Such image data is transferred through the interface connector 26 and, under control of the appliance interface circuit and DMA controller, stored in the temporary storage RAM 24. The image data remains stored in the temporary storage RAM until a occurrence of a predetermined event, such as a signal received by the appliance interface circuit from the camera for example. Upon occurrence of the predetermined event the image data stored in the temporary storage RAM is therefrom using the DMA controller 32 and written into the write-once memory module storage 20 using the memory module control circuit 34.

Figure 4:
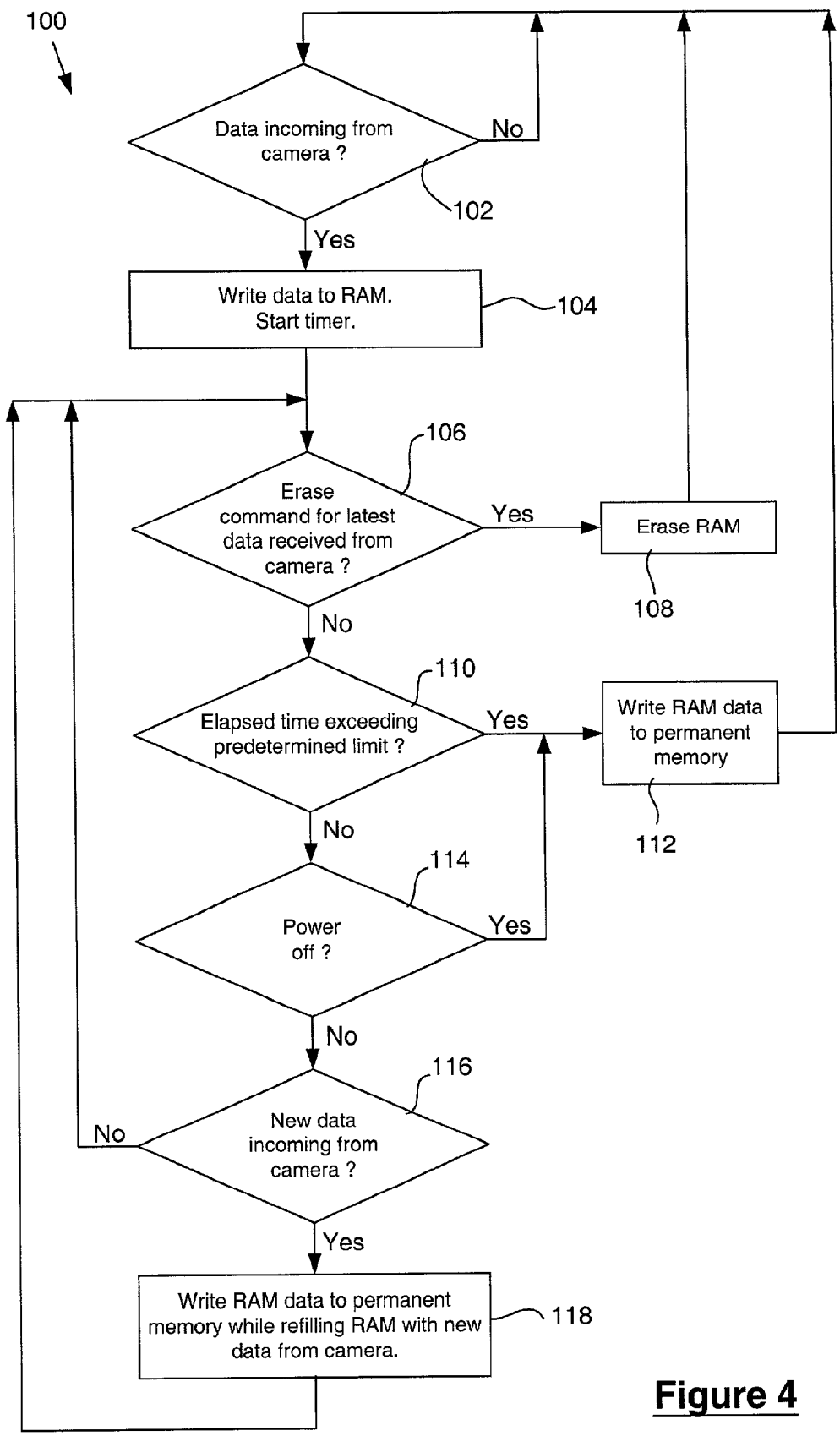
FIG. 4 is a flow-chart diagram illustrating operational procedures of the memory system.

A more detailed explanation of the operation of the memory card in the preferred implementation is provided below with reference to FIG. 4 which is a flowchart diagram of the memory card general operating procedure 100. The functions of the procedure 100 may be carried out by, or under the control of, the appliance interface circuit 30. Those functions that are not performed by the appliance interface circuit 34 are carried out by other elements of the memory card, as will be readily apparent from the description that follows.

When a picture is taken by the digital camera, image data is generated as and passed to the memory card 10 by way of electrical connections through the card interface connector 26. The incoming data, or a preceding control signal indicating that incoming data is to follow, is determined by the appliance interface circuit at 102. The image data incoming from the digital camera is written to the temporary storage RAM 24 using the DMA controller 32. This stores the image data for the last picture taken by the camera in the temporary memory so that it may be manipulated (e.g. deleted) before it is permanently stored in the write-once memory module 20. At the time the image data is written to the RAM (at 104), a timer is started which keeps account of how long the image data has been held in the temporary storage memory.

One of the functions that digital camera users have become accustomed to through the use of re-writable image data storage media is the ability to erase an image that is unsatisfactory for whatever reason. Using write-once storage memory, if the image data were stored immediately therein following its generation, it could not be later completely erased if it were not required for continued storage. The temporary storage RAM provides an interim storage facility to enable the user selective erasure of an image to be implemented with a write-once storage medium.

Whilst the image data is stored in the temporary storage RAM, a representation of the image may typically be displayed on a display screen or the like of the camera to allow the user to view the picture just taken. If the picture viewed by the user is unsatisfactory for some reason, the user may press a button on the camera to discard the picture. This action issues an erase command to the memory card, which is received by the appliance interface circuit at 106. If an erase command is received from the camera at 106, the image data is erased from the RAM at 108, and the procedure then returns to await further incoming image data at 102.

If no erase command is received from the camera at 106 then the aforementioned timer is examined at 110. If the timer indicates that a predetermined time period has elapsed since the image data was stored in the RAM, then the image data in RAM is transferred to the permanent storage in the memory module at 112. This function is based on the assumption that, if the user does not instruct destruction of the picture (i.e. an erase command) within a certain time period, then the user wishes to retain the picture and so the image data may be transferred to the permanent storage memory.

The power for the memory card 10 would typically be provided from the digital camera power source. This means that the power supply to the memory card may be cut if the camera is turned off, the camera power supply is depleted, or the memory card removed from the camera. Accordingly, it is desirable that the memory card include a short-term internal power supply such as a capacitive storage element, small rechargeable battery or other power storage component (not illustrated in the drawings). The short term internal power supply should be sufficient to supply power to the memory card circuitry in the absence of external power for an amount of time sufficient to transfer the contents of the RAM 24 to the non-volatile memory module 20. This allows any image data in the temporary storage RAM to be safely stored in the memory module 20 in the event of a loss of external power to the memory card for whatever reason. The procedure 100 tests for such a power loss at 114 and, if detected, the image data is transferred from RAM to the memory module at 112. Otherwise the procedure continues to 116.

Another event that necessitates transferring image data from the temporary storage RAM to the memory module is when a new picture is taken by the camera 2. At 116 the procedure 100 determines if new image data is incoming from the camera, representing a new picture. Alternatively, a control signal indicating that a new picture has been taken and that new image data is to follow could be used as a determinant at 116. If no new image data is indicated at 116 the procedure returns to 106 to check for an erase command. If new incoming image data is indicated at 116 then it is necessary to store the new data in the temporary storage RAM 24. Accordingly, the DMA controller 32 is used at 118 to simultaneously: 1) read existing data from the RAM and pass it to the memory module control circuit to be written to the memory module non-volatile storage; and 2) write new image data incoming from the camera to the RAM 24, overwriting only the existing data that has at the time already been transferred to the memory module. Once the previous picture has been stored in the memory module and the new picture has been stored in the RAM, the storage timer is set and the procedure returns to 106.

As described in the specification of the referenced co-pending U.S. patent application, the memory module suitable for use in the memory card of the preferred embodiment is able to provide data storage in capacities sufficient to store numerous digital photographs and can be produced at relatively low cost. For example, a high capacity storage device (e.g. 100 MB to over 1 GB) may be provided at low cost (e.g., less than about $5) for permanent archival image data storage.

As the data storage in the memory module is separate from the circuitry responsible for controlling the read/write functions thereof, and the memory module can therefore be replaced when it has reached storage capacity and another memory module can be used with the same control circuitry. This means that the reusable components of the memory card do not have to be replaced when more data storage is required. Also, the interface and control circuitry can be relatively complex because it is not limited by the memory module fabrication process, and can be relatively expensive since it represents a one time cost in the memory system. This can be exploited by providing sophisticated error detection and correction capability in the interface and control circuitry which allows the memory system to be error tolerant despite remote sensing and able to cope with imperfectly fabricated memory modules thereby increasing the number of useable memory modules from an imperfect fabrication process yield.

Compared to Flash memory cards currently in use in digital cameras, the memory system of the preferred embodiment has several advantages. The memory system of the preferred embodiment allows for digital image storage at lower cost, greater volumetric density, and permanence. Such a memory system represents to digital photography what film is to conventional photography, whilst maintaining the convenience of allowing for discard of a picture that turns out to be undesired before that picture is permanently stored. The material and fabrication costs are low enough that the memory modules may be accepted as a consumable. An irreversible write process provides a permanent archive of photos, as the negative does for conventional photography. This is not the case with Flash memory, which requires the user to select a secondary archive medium and transfer the data to that medium. The large volumetric storage density that can be provided by the memory system of the preferred embodiment allows sufficient memory to be fit into compact form factors, and thereby enables new use models, such as video, for digital photography. Compared to the other storage modalities mentioned above (hard disc, removable optical disc, or tape) the present memory system and Flash memory share the same advantages of mechanical robustness, low power consumption, compactness, and rapid access.

The foregoing detailed description of a preferred embodiment of the present invention is presented by way of example only, and many variations to the circuits, structures, arrangements and processes described are possible without departing from the scope of the invention. For example, the memory system of the preferred embodiment is described primarily in the context of a removable memory module for use in an industry standard interface card, such as PCMCIA, Smart Media, SD, MMC or Compact Flash, or in a custom interface card. However, it will be recognized that components that are described herein as being incorporated in the memory card 10 may equally be embedded in or combined with components of the digital camera itself. The memory module that provides the write-once storage should be removable to allow for additional picture storage with a new module, but the other components of the memory card may remain in the camera. On the other hand, whilst the memory is described as being separate from controlling circuitry in order to reduce the cost of a removable memory module, it is also possible to use a unified structure where controlling circuitry is incorporated into the removable memory module package. This may be appropriate where very large (and relatively more expensive) memory modules are constructed where the controlling circuitry cost is a smaller proportion of the consumable module cost or potential sale price.

The principles of the present invention can be applied with many other variations to the circuits, structures, arrangements and processes described herein, as will be apparent to those of ordinary skill in the art, without departing from the scope of the invention as defined in the appended claims.

We claim:

1. A data storage system for a portable data generating appliance comprising:
   a temporary data storage circuit coupled, in use, to receive data from the appliance, where the temporary data storage circuit has a storage capacity sufficient to store data comprising at least one picture from the appliance;
   a permanent data storage circuit coupled, in use, to receive data from the temporary data storage circuit; and
   a control circuit coupled to the temporary data storage circuit and the permanent data storage circuit, wherein the control circuit monitors the amount of time that data is held in the temporary data storage circuit and, after data is held in the temporary data storage circuit for a predetermined time period, causes the data to be transferred to the permanent data storage circuit; and
   the control circuit is further operative to effect transfer of data from the temporary data storage circuit to the permanent data storage circuit upon occurrence of further data being received by the temporary data storage circuit from the data generating appliance.

2. A data storage system as claimed in claim 1, wherein the portable data generating appliance is a digital camera.

3. A data storage system as claimed in claim 2, wherein the portable data generating appliance is a digital still image camera.

4. A data storage system as claimed in claim 1, wherein the data storage system is contained in an interface card that is separable from the data generating appliance and, in use, is received by the data generating appliance to provide coupling for data transfer from the data generating appliance to said temporary data storage circuit.

5. A data storage system as claimed in claim 1, wherein the permanent data storage circuit comprises a non-volatile memory module that is detachably coupled to the data storage system to allow a plurality of different non-volatile memory modules to be used in a single data storage system.

6. A data storage system as claimed in claim 4, wherein the permanent data storage circuit comprises a non-volatile memory module that is replaceable in the interface card to allow a plurality of different memory modules to be used in a single data storage system.

7. A data storage system as claimed in claim 3, where the storage capacity is sufficient to store data comprising substantially one picture from the digital still image camera.

8. A data storage system as claimed in claim 7, wherein the temporary data storage circuit comprises RAM.

9. A data storage system as claimed in claim 7, wherein the temporary data storage circuit comprises Flash memory.

10. A data storage system as claimed in claim 1, wherein the permanent data storage circuit comprises non-volatile write-once memory.

11. A data storage system as claimed in claim 1, wherein the control circuit causes the data to be transferred to the permanent data storage circuit after the predetermined time period an erase command is not received by the control circuit during the predetermined time period.

12. A data storage system as claimed in claim 1, wherein the control circuit is effective to simultaneously control transfer of data from the temporary data storage circuit to the permanent data storage circuit and transfer said further data from the data generating appliance into the temporary data storage circuit.

13. A data storage system as claimed in claim 1, wherein the data storage system derives primary operating power from the data generating appliance, and wherein the predetermined event comprises disconnection of power supply from the data generating appliance to the data storage system.

14. A data storage system as claimed in claim 13, including a short term power supply circuit adapted to supply power to the data storage system sufficient to transfer the data contents of the temporary data storage circuit to the permanent data storage circuit.

15. A method for storing image data for a digital camera, comprising:
   obtaining image data generated by the digital camera representing at least one picture;
   storing said image data in a temporary data storage circuit coupled to the digital camera;
   monitoring the amount of time that said image data is held in the temporary data storage circuit;
   after said image data is held in the temporary data storage circuit for a predetermined time period, transferring said image data from said temporary data storage circuit to a permanent data storage circuit coupled to the digital camera;
   obtaining further image data generated by the digital camera representing at least one picture; and
   transferring said image data from said temporary data storage circuit to said permanent data storage circuit upon obtaining said further image data.

16. A method as claimed in claim 15, further comprising:
   monitoring whether an erase command is received, wherein said image data is transferred from said temporary data storage circuit to said permanent data storage circuit after the predetermined time period if an erase command is not received during the predetermined time period.

17. A method as claimed in claim 15, further comprising:
   testing for a power loss; and
   transferring said image data from said temporary data storage circuit to said permanent data storage circuit upon determining that a power less has occurred.

18. A data storage system for a portable data generating appliance comprising:
   a temporary data storage circuit coupled, in use, to receive data from the appliance, where the temporary data storage circuit has a storage capacity sufficient to store data comprising at least one picture from the appliance, wherein the appliance is a digital still image camera and the storage capacity is sufficient to store data comprising substantially one picture from the digital still image camera;
   a permanent data storage circuit coupled, in use, to receive data from the temporary data storage circuit; and
   a control circuit coupled to the temporary data storage circuit and the permanent data storage circuit, wherein the control circuit monitors the amount of time that data is held in the temporary data storage circuit and, after data is held in the temporary data storage circuit for a predetermined time period, causes the data to be transferred to the permanent data storage circuit; and
   wherein the temporary data storage circuit comprises flash memory.

* * * * *